(12) United States Patent
Han

(10) Patent No.: US 11,545,705 B2
(45) Date of Patent: Jan. 3, 2023

(54) SECONDARY BATTERY AND BATTERY PACK INCLUDING THE SAME

(71) Applicant: LG Chem, Ltd., Seoul (KR)

(72) Inventor: Song-Yi Han, Daejeon (KR)

(73) Assignee: LG Energy Solution, Ltd.

( * ) Notice: Subject to any disclaimer, the term of this patent is extended or adjusted under 35 U.S.C. 154(b) by 289 days.

(21) Appl. No.: 16/628,204

(22) PCT Filed: Feb. 13, 2019

(86) PCT No.: PCT/KR2019/001774
§ 371 (c)(1),
(2) Date: Jan. 2, 2020

(87) PCT Pub. No.: WO2019/160334
PCT Pub. Date: Aug. 22, 2019

(65) Prior Publication Data
US 2021/0036386 A1    Feb. 4, 2021

(30) Foreign Application Priority Data

Feb. 19, 2018    (KR) .................. 10-2018-0019432

(51) Int. Cl.
*H01M 10/48* (2006.01)
*G01R 31/392* (2019.01)
(Continued)

(52) U.S. Cl.
CPC .......... *H01M 10/48* (2013.01); *G01R 31/364* (2019.01); *G01R 31/392* (2019.01);
(Continued)

(58) Field of Classification Search
CPC .. H01M 10/48; H01M 10/0585; H01M 50/10; H01M 50/102; H01M 50/103;
(Continued)

(56) References Cited

U.S. PATENT DOCUMENTS 8,586,222 B2 * 11/2013 Timmons .............. H01M 4/485
429/91
8,679,677 B1 * 3/2014 Tamaki ............. H01M 10/0436
429/234
2006/0057433 A1 3/2006 Ando et al.
(Continued)

FOREIGN PATENT DOCUMENTS

CN        1735949 A      2/2006
CN      108886163 A     11/2018
(Continued)

OTHER PUBLICATIONS

International Search Report from Application No. PCT/KR2019/001774 dated May 30, 2019, 2 pages.
(Continued)

*Primary Examiner* — Matthew T Martin
*Assistant Examiner* — Katharine A Caughron
(74) *Attorney, Agent, or Firm* — Lerner, David, Littenberg, Krumholz & Mentlik, LLP

(57) ABSTRACT

A secondary battery configured to effectively estimate the life or degradation of the secondary battery as the secondary battery degrades includes a packaging material, an electrode assembly, a first electrode lead, a second electrode lead, a first measuring lead, and a second measuring lead. The electrode assembly includes a stack having a plurality of first electrode plates at respective first locations within the stack and a plurality of second electrode plates at respective second locations within the stack, the first and second locations alternating with one another and having a separator interposed between each of the first and second locations. The electrode assembly further includes a first measuring plate and a second measuring plate having the same polarity as the first electrode plates and located at at least one of the first locations within the stack.

11 Claims, 7 Drawing Sheets

(51) Int. Cl.
*G01R 31/364* (2019.01)
*H01M 50/531* (2021.01)
*H01M 50/10* (2021.01)
*H01M 10/0585* (2010.01)

(52) U.S. Cl.
CPC ....... *H01M 10/0585* (2013.01); *H01M 50/10* (2021.01); *H01M 50/531* (2021.01)

(58) Field of Classification Search
CPC ............. H01M 50/105; H01M 50/107; H01M 50/109; H01M 50/11; H01M 50/14; H01M 50/141; H01M 50/143; H01M 50/145; H01M 50/531; H01M 50/131; H01M 50/133; H01M 50/134; H01M 50/136; H01M 50/116; G01R 31/364; G01R 31/392; G01R 31/36–3644
See application file for complete search history.

(56) References Cited

U.S. PATENT DOCUMENTS

| | | | |
|---|---|---|---|
| 2013/0009604 A1 | 1/2013 | Bhardwaj et al. | |
| 2016/0308260 A1* | 10/2016 | Yu ...................... | H01M 50/543 |
| 2017/0149024 A1* | 5/2017 | Park ..................... | H01M 50/105 |
| 2019/0044097 A1* | 2/2019 | Yu ...................... | H01M 10/058 |
| 2019/0064275 A1 | 2/2019 | Han et al. | |
| 2019/0190092 A1 | 6/2019 | Kim et al. | |
| 2021/0036386 A1 | 2/2021 | Han | |

FOREIGN PATENT DOCUMENTS

| | | |
|---|---|---|
| CN | 108886179 A | 11/2018 |
| CN | 209401700 U | 9/2019 |
| DE | 102011120512 A1 | 6/2013 |
| EP | 1577914 A1 | 9/2005 |
| EP | 3413387 A1 | 12/2018 |
| EP | 3442073 A1 | 2/2019 |
| JP | 2010218877 A | 9/2010 |
| JP | 2012079582 A | 4/2012 |
| JP | 2013118090 A | 6/2013 |
| JP | 2013201358 A | 10/2013 |
| JP | 2014212056 A | 11/2014 |
| JP | 2016143452 A | 8/2016 |
| KR | 20150040463 A | 4/2015 |
| KR | 20160041679 A | 4/2016 |
| KR | 20160121179 A | 10/2016 |
| KR | 20170043761 A | 4/2017 |

OTHER PUBLICATIONS

European Search Report for Application No. EP 19754575, dated Oct. 26, 2020, 8 pages.
Search Report dated Apr. 18, 2022 from the Office Action for Chinese Application No. 201910121379.4 dated Apr. 22, 2022, pp. 1-3.

* cited by examiner

SECONDARY BATTERY AND BATTERY PACK INCLUDING THE SAME

CROSS-REFERENCE TO RELATED APPLICATIONS

The present application is a national phase entry under 35 U.S.C. § 371 of International Application No. PCT/KR2019/001774 filed Feb. 13, 2019, which claims priority from Korean Patent Application No. 10-2018-0019432 filed on Feb. 19, 2018, the disclosures of which are incorporated herein by reference in their entirety.

BACKGROUND OF THE DISCLOSURE

Field of the Disclosure

The present disclosure relates to a secondary battery and a battery pack, and more particularly, to a secondary battery configured such that the life or degradation of the secondary battery is effectively estimated as the secondary battery degrades, and a battery pack including the same.

Description of the Related Art

Recently, there has been dramatically growing demand for portable electronic products such as laptop computers, video cameras and mobile phones, and with the intense development of electric vehicles, accumulators for energy storage, robots and satellites, many studies are being made on high performance secondary batteries that can be recharged repeatedly.

Currently, commercially available secondary batteries include nickel-cadmium batteries, nickel-hydrogen batteries, nickel-zinc batteries, lithium secondary batteries and the like, and among them, lithium secondary batteries have little or no memory effect, and thus they are gaining more attention than nickel-based secondary batteries for their advantages of free charging and discharging, a very low self-discharge rate and high energy density.

A lithium secondary battery mainly uses lithium-based oxide and a carbon material for a positive electrode active material and a negative electrode active material, respectively. The lithium secondary battery includes an electrode assembly including a positive electrode plate and a negative electrode plate coated respectively with the positive electrode active material and the negative electrode active material with a separator interposed between, and a packaging material, i.e., a battery case hermetically sealed to receive the electrode assembly therein together with an electrolyte solution.

In general, lithium secondary batteries may be classified into can-type secondary batteries, in which an electrode assembly is embedded in a metal can, and secondary batteries in which an electrode assembly is embedded in a pouch of an aluminum laminate sheet, according to the shape of the packaging material. These secondary batteries are usually manufactured by receiving the electrode assembly in the packaging material, and in this state, injecting an electrolyte solution, and sealing the packaging material.

More recently, with the extended application range of secondary batteries, secondary batteries are being widely used in small portable devices including smart phones, as well as medium- and large-scale devices such as electric vehicles including hybrid vehicles or energy storage systems.

In the case of a secondary battery, as the usage period increases, the performance degrades compared to the initial state. Additionally, performance degradation estimation of the secondary battery is said to be State Of Health (SOH) estimation of the secondary battery, and the SOH of the secondary battery is an important factor in determining when to replace the secondary battery.

Additionally, the secondary battery may differ in degradation for each secondary battery depending on environments in which the secondary battery is manufactured and used. Additionally, in the case of a battery pack including a plurality of secondary batteries, it is necessary to accurately estimate the life of each secondary battery as the secondary batteries degrade. Typically, a Battery Management System (BMS) is required to accurately estimate to the life of each secondary battery provided in the battery pack, and based on this, operate the battery pack efficiently.

SUMMARY OF THE DISCLOSURE

The present disclosure is designed in view of the background of the related art as described above, and therefore the present disclosure is directed to providing an improved secondary battery for effectively estimating the life or degradation of the secondary battery as the secondary battery degrades.

These and other objects and advantages of the present disclosure will be understood by the following description and will be apparent from the embodiments of the present disclosure. Additionally, it will be readily understood that the objects and advantages of the present disclosure are realized by the means set forth in the appended claims and combinations thereof.

A secondary battery according to an aspect of the present disclosure may include a packaging material including an upper cover and a lower cover, the packaging material formed by sealing an outer periphery of the upper cover and an outer periphery of the lower cover. The secondary battery may include an electrode assembly including a plurality of first electrode plates, a plurality of second electrode plates stacked in an alternating manner with the plurality of first electrode plates with a separator interposed between, a first measuring plate and a second measuring plate having a same polarity as the first electrode plate and included in at least one of the plurality of first electrode plates, a first electrode tab extending from the first electrode plate, a second electrode tab extending from the second electrode plate, a first measuring tab extending from the first measuring plate, and a second measuring tab extending from the second measuring plate. The secondary battery may further include a first electrode lead having one end in contact with the first electrode tab and the other end exposed outside the packaging material, a second electrode lead having one end in contact with the second electrode tab and the other end exposed outside the packaging material, a first measuring lead having one end in contact with the first measuring tab and the other end exposed outside the packaging material, and a second measuring lead having one end in contact with the second measuring tab and the other end exposed outside the packaging material.

The first electrode plate and the second electrode plate may have different polarities.

The first measuring plate and the second measuring plate may be included in any one of the plurality of first electrode plates such that the first measuring plate and the second measuring plate are spaced a predetermined distance apart.

The electrode assembly may further include an insulating element configured to fix the first measuring plate and the second measuring plate, and to electrically isolate the first measuring plate from the second measuring plate.

The first measuring plate and the second measuring plate may be each included in any two of the plurality of first electrode plates.

The electrode assembly may be configured such that the first electrode lead, the second electrode lead, the first measuring lead, and the second measuring lead are disposed on a same plane with each of their lengthwise directions facing a same direction.

The first measuring tab may be integrated with the first measuring lead in a form of a plate.

The second measuring tab may be integrated with the second measuring lead in a form of a plate.

The positive electrode lead, the negative electrode lead, the first measuring lead, and the second measuring lead may extend out of the packaging material in a same direction.

The positive electrode lead, the negative electrode lead, the first measuring lead, and the second measuring lead may be bent up or down in a same direction.

A battery pack according to another aspect of the present disclosure may include the secondary battery according to an aspect of the present disclosure.

According to an aspect of the present disclosure, in a secondary battery, there is provided a structure that can externally measure a reaction non-uniformity phenomenon occurring in the plane direction of a plurality of electrode plates provided in an electrode assembly as the secondary battery degrades, the secondary battery, helping to determine the level of degradation more easily and accurately.

Particularly, according to an embodiment of the present disclosure, in the case of a secondary battery, it is possible to accurately measure the degree of reaction non-uniformity by measuring a potential difference between two electrode plates that replace one or two electrode plates, and through this, there is provided an improved secondary battery that can effectively estimate the life or degradation of the secondary battery.

The present disclosure may have a variety of other effects, and these and other effects of the present disclosure can be understood by the following description and will be apparent from the embodiments of the present disclosure.

BRIEF DESCRIPTION OF THE DRAWINGS

The accompanying drawings illustrate preferred embodiments of the present disclosure, and together with the following detailed description, serve to provide a further understanding of the technical aspects of the present disclosure. However, the present disclosure is not to be construed as being limited to the drawings.

DESCRIPTION OF THE PREFERRED EMBODIMENT

Figure 1:
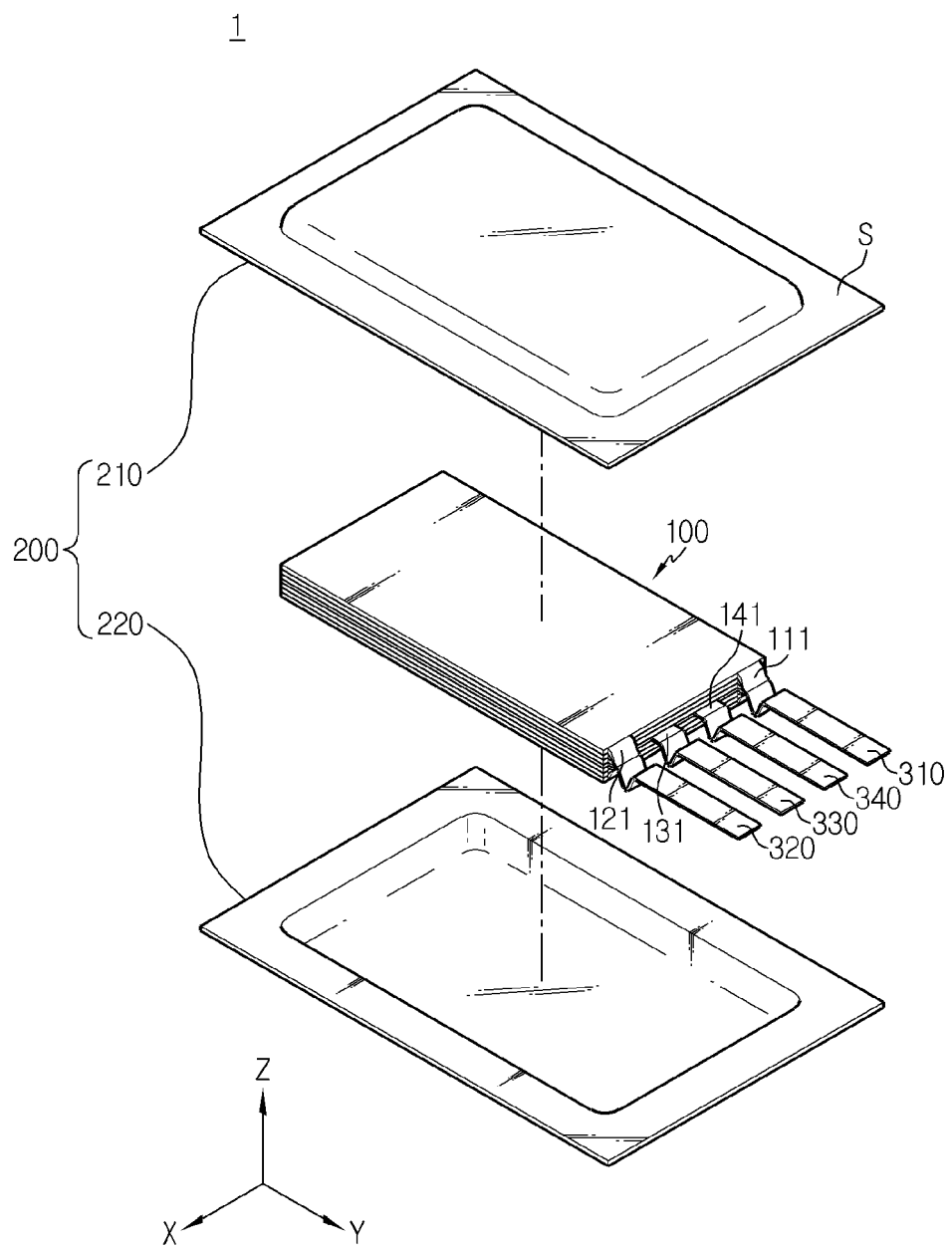
FIG. 1 is a schematic exploded perspective view showing the configuration of a secondary battery according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as limited to general and dictionary meanings, but rather interpreted based on the meanings and concepts corresponding to technical aspects of the present disclosure on the basis of the principle that the inventor is allowed to define terms appropriately for the best explanation.

Therefore, the embodiments described herein and illustrations shown in the drawings are just a most preferred embodiment of the present disclosure, but not intended to fully describe the technical aspects of the present disclosure, so it should be understood that other equivalents and modifications could have been made thereto at the time of filing the application.

Additionally, in describing the present disclosure, when it is deemed that a certain detailed description of relevant known elements or functions renders the key subject matter of the present disclosure ambiguous, the detailed description is omitted herein.

Unless the context clearly indicates otherwise, it will be understood that the term "comprises" or "includes" when used in this specification, specifies the presence of stated elements, but does not preclude the presence or addition of one or more other elements.

In addition, throughout the specification, it will be further understood that when an element is referred to as being "connected to" another element, it can be directly connected to the other element or intervening elements may be present.

Figure 2:
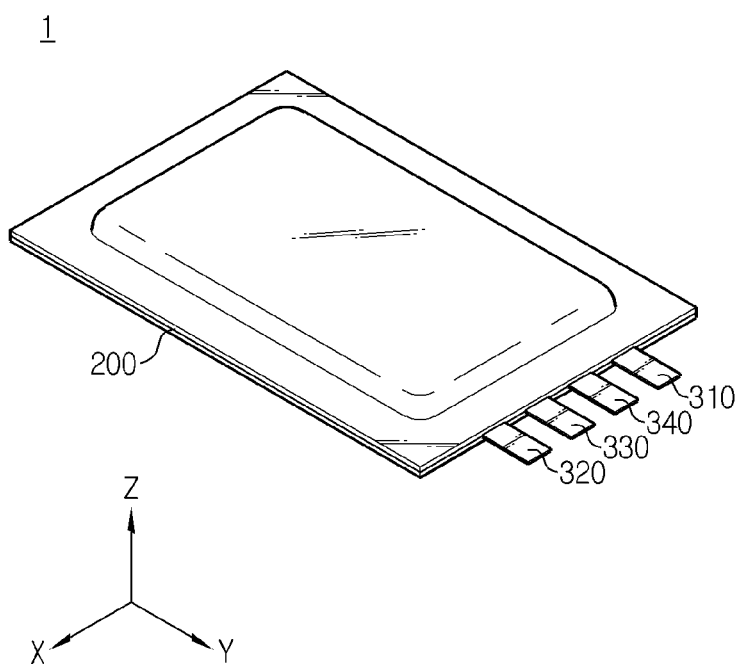
FIG. 2 is an assembled perspective view of the secondary battery shown in FIG. 1.

FIG. 1 is a schematic exploded perspective view showing the configuration of a secondary battery according to an embodiment of the present disclosure, and FIG. 2 is an assembled perspective view of the secondary battery shown in FIG. 1.

Referring to FIGS. 1 and 2, the secondary battery 1 according to the present disclosure includes a packaging material 200, an electrode assembly 100, a positive electrode lead 310, a negative electrode lead 320, a first measuring lead 330 and a second measuring lead 340. The secondary battery 1 may be a pouch type.

The packaging material 200 may have a concave internal space, and the electrode assembly 100 and an electrolyte solution may be received in the internal space.

Particularly, the packaging material 200 may include an upper cover 210 and a lower cover 220, and in this case, the concave internal space may be formed in both the upper cover 210 and the lower cover 220 as shown in FIG. 1.

The packaging material 200 may be formed by sealing the outer periphery of the upper cover 210 and the lower cover 220. That is, each of the upper cover 210 and the lower cover 220 may have a sealing part S at the edges of the internal space, and the internal space of the packaging material 200 may be hermetically closed by sealing the sealing part S by heat fusion.

The electrode assembly 100 may include a separator, a plurality of first electrode plates 110, a plurality of second electrode plates 120, a plurality of first electrode tabs 111, a plurality of second electrode tabs 121, a first measuring plate, a second measuring plate, a first measuring tab and a second measuring tab. Hereinafter, for convenience of description, assume that the first electrode plate is a positive electrode plate and the second electrode plate is a negative electrode plate. In this case, the first electrode tab may be referred to as a positive electrode tab and the second electrode tab may be referred to as a negative electrode tab. Of course, the present disclosure is not limited thereto, and the first electrode plate may be a negative electrode plate and the second electrode plate may be a positive electrode plate.

Figure 3:
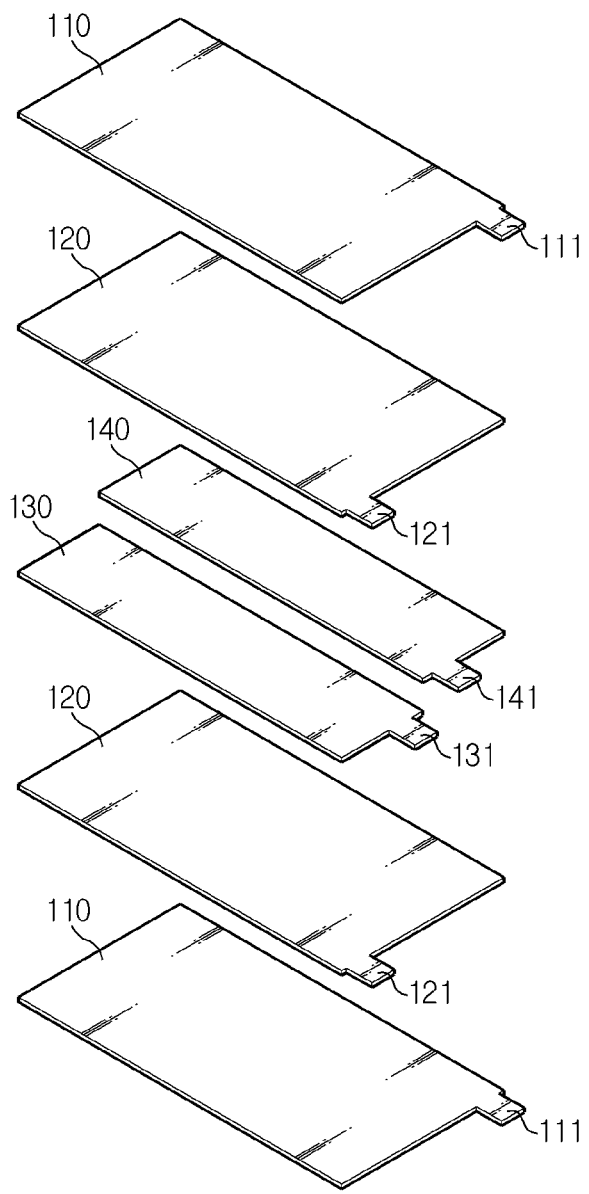
FIG. 3 is a schematic exploded perspective view showing the configuration of an electrode assembly according to an embodiment of the present disclosure.

The configuration of the electrode assembly 100 will be described in detail with reference to FIG. 3. FIG. 3 is a schematic exploded perspective view showing the configuration of the electrode assembly according to an embodiment of the present disclosure. However, for convenience of description, the separator is not shown in FIG. 3. Referring to FIG. 3, the electrode assembly 100 includes a plurality of electrode plates 110, 120, 130 and 140 with the separator interposed between. Particularly, the plurality of electrode plates, stacked with the separator interposed between, is received in the internal space of the packaging material 200. More specifically, the electrode assembly 100 may include the plurality of positive electrode plates 110 and the plurality of negative electrode plates 120 stacked in an up-down direction.

Here, the electrode plate is the positive electrode plate 110 or the negative electrode plate 120, and the electrode assembly 100 may include the positive electrode plate 110 and the negative electrode plate 120 stacked with their wide surfaces facing each other, and the separator interposed between. That is, the electrode assembly 100 may include the positive electrode plate 110 and the negative electrode plate 120 stacked in an alternating manner with the separator interposed between, and the positive electrode plate 110 and the negative electrode plate 120 are spaced a predetermined distance apart from each other. Additionally, the positive electrode plate 110 and the negative electrode plate 120 are formed by applying an active material slurry to a current collector, and the slurry may be generally formed by shaking a particulate active material, an auxiliary conductor, a binder and a plasticizer with an addition of solvents.

The positive electrode tab 111 may extend from the plurality of positive electrode plates 110, and the negative electrode tab 121 may extend from the plurality of negative electrode plates 120. More specifically, the positive electrode plate 110 may have the positive electrode tab 111 in a non-coated region where the positive electrode active material is not coated, and the negative electrode plate 120 may have the negative electrode tab 121 in a non-coated region where the negative electrode active material is not coated. For example, the positive electrode tab 111 and the negative electrode tab 121 may extend out of the electrode plate, and may be formed by cutting the electrode plate or by attaching a metal plate of a same or different material to the electrode plate.

The first measuring plate 130 and the second measuring plate 140 have the same polarity. For example, both the first measuring plate 130 and the second measuring plate 140 may be a plate having the positive or negative polarity. More specifically, the first measuring plate 130 and the second measuring plate 140 may be formed by applying a positive electrode active material to the surface of an aluminum current collector, or by applying a negative electrode active material to the surface of an aluminum current collector.

The first measuring plate 130 and the second measuring plate 140 may be provided in place of at least one of the positive electrode plate 110 and the negative electrode plate 120. More specifically, the first measuring plate 130 and the second measuring plate 140 may be provided at the position of at least one positive electrode plate 110 or negative electrode plate 120 in place of the at least one positive electrode plate 110 or negative electrode plate 120 of the plurality of positive electrode plates 110 and the plurality of negative electrode plates 120 stacked in an alternating manner in the up-down direction.

For example, the first measuring plate 130 and the second measuring plate 140 may be provided at the position of a positive electrode plate 110 in place of the positive electrode plate 110. In this instance, both the first measuring plate 130 and the second measuring plate 140 may be a plate having the positive polarity. Likewise, the first measuring plate 130 and the second measuring plate 140 may be provided at the position of a negative electrode plate 120 in place of the negative electrode plate 120. In this instance, both the first measuring plate 130 and the second measuring plate 140 may be a plate having the negative polarity.

The first measuring tab 131 is electrically connected to the first measuring plate 130, and the second measuring tab 141 is electrically connected to the second measuring plate 140. Here, the first measuring tab 131 may extend from the first measuring plate 130, and the second measuring tab 141 may extend from the second measuring plate 140. More specifically, the first measuring plate 130 may have the first measuring tab 131 in a non-coated region where the positive electrode active material is not coated, and the second measuring plate 140 may have the second measuring tab 141 in a non-coated region where the negative electrode active material is not coated. For example, the first measuring tab 131 and the second measuring tab 141 may extend out of the first measuring plate 130 and the second measuring plate 140. In this instance, the first measuring tab 131 and the second measuring tab 141 may be formed by cutting the first measuring plate 130 and the second measuring plate 140 or by attaching a metal plate of a same or different material to the first measuring plate 130 and the second measuring plate 140.

One end of the positive electrode lead 310 electrically contacts the positive electrode tab 111, and the other end is exposed outside the packaging material 200. Additionally, a portion of the positive electrode lead 310 is inserted into the packaging material 200. More specifically, the plurality of positive electrode tabs 111 extending out of each of the plurality of positive electrode plates 110 may be connected to the positive electrode lead 310 when they are brought into contact. In this instance, the connection between the plurality of positive electrode tabs 111 and/or the connection between the positive electrode tab 111 and the positive electrode lead 310 may be carried out by a welding process. For example, as shown in FIG. 1, the positive electrode lead 310 may be directly connected to the plurality of positive electrode tabs 111 extending out of the plurality of positive electrode plates 110.

Additionally, the positive electrode lead 310 may be interposed between the upper cover 210 and the lower cover 220 such that part of the positive electrode lead 310 may be disposed in the internal space of the packaging material 200. Additionally, the remaining part of the positive electrode lead 310 may be exposed outside the packaging material 200. For example, as shown in FIG. 2, the positive electrode lead 310 may extend in the outward direction of the packaging material 200 with the part exposed outside the packaging material 200.

One end of the negative electrode lead 320 electrically contacts the negative electrode tab 121, and the other end is exposed outside the packaging material 200. Additionally, a portion of the negative electrode lead 320 is inserted into the packaging material 200. More specifically, the plurality of negative electrode tabs 121 extending out of each of the plurality of negative electrode plates 120 may be connected to the negative electrode lead 320 when they are brought into contact. In this instance, the connection between the plurality of negative electrode tabs 121 and/or the connection between the negative electrode tab 121 and the negative electrode lead 320 may be carried out by a welding process. For example, as shown in FIG. 1, the negative electrode lead 320 may be directly connected to the plurality of negative electrode tabs 121 extending out of the plurality of negative electrode plates 120.

Additionally, the negative electrode lead 320 may be interposed between the upper cover 210 and the lower cover 220 such that part of the negative electrode lead 320 may be disposed in the internal space of the packaging material 200. Additionally, the remaining part of the negative electrode lead 320 may be exposed outside the packaging material 200. For example, as shown in FIG. 2, the negative electrode lead 320 may extend in the outward direction of the packaging material 200 with the part exposed outside the packaging material 200.

One end of the first measuring lead 330 electrically contacts the first measuring tab 131, and the other end is exposed outside the packaging material 200. Additionally, part of the first measuring lead 330 is inserted into the packaging material 200. More specifically, the first measuring tab 131 extending out of the first measuring plate 130 may be connected to the first measuring lead 330. In this instance, the connection between the first measuring tab 131 and the first measuring lead 330 may be carried out by a welding process. For example, as shown in FIG. 1, the first measuring lead 330 may be directly connected to the first measuring tab 131 extending out of the first measuring plate 130.

Additionally, the first measuring lead 330 may be interposed between the upper cover 210 and the lower cover 220 such that part of the first measuring lead 330 may be disposed in the internal space of the packaging material 200. Additionally, the remaining part of the first measuring lead 330 may be exposed outside the packaging material 200. For example, as shown in FIG. 2, the first measuring lead 330 may extend in the outward direction of the packaging material 200 with the part exposed outside the packaging material 200.

One end of the second measuring lead 340 electrically contacts the second measuring tab 141, and the other end is exposed outside the packaging material 200. Additionally, a portion of the second measuring lead 340 is inserted into the packaging material 200. More specifically, the second measuring tab 141 extending out of the second measuring plate 140 may be connected to the second measuring lead 340. In this instance, the connection between the second measuring tab 141 and the second measuring lead 340 may be carried out by a welding process. For example, as shown in FIG. 1, the second measuring lead 340 may be directly connected to the second measuring tab 141 extending out of the second measuring plate 140.

Additionally, the second measuring lead 340 may be interposed between the upper cover 210 and the lower cover 220 such that part of the second measuring lead 340 may be disposed in the internal space of the packaging material 200. Additionally, the remaining part of the second measuring lead 340 may be exposed outside the packaging material 200. For example, as shown in FIG. 2, the second measuring lead 340 may extend in the outward direction of the packaging material 200 with the part exposed outside the packaging material 200.

The present disclosure may estimate the state of the secondary battery using the first measuring lead 330 and the second measuring lead 340. Particularly, the present disclosure may estimate the life or degradation of the secondary battery using a potential difference between the first measuring lead 330 and the second measuring lead 340. For example, as the secondary battery 1 degrades, a potential difference occurs between the first measuring lead 330 and the second measuring lead 340, and the life of the secondary battery may be estimated according to the degree of the potential difference occurred.

The first measuring tab 131 may be integrated into one plate with the first measuring lead 330. Additionally, the second measuring tab 141 may be integrated into one plate with the second measuring lead 340.

Additionally, the positive electrode lead 310, the negative electrode lead 320, the first measuring lead 330 and the second measuring lead 340 may run in the same direction from the packaging material 200. For example, as shown in FIGS. 1 and 2, the positive electrode lead 310, the negative electrode lead 320, the first measuring lead 330 and the second measuring lead 340 may extend in +y-axis direction of FIGS. 1 and 2.

According to this configuration of the present disclosure, it is possible to easily measure the voltage across the first measuring lead and the second measuring lead. Particularly, the first measuring lead 330 and the second measuring lead 340 may easily come into contact with measuring terminals that are connected to the first measuring lead 330 and the second measuring lead 340.

Additionally, the first measuring tab 131 and the second measuring tab 141 may be formed at different positions in the horizontal direction from the positions of the positive electrode tab 111 and the negative electrode tab 121 between the positive electrode tab 111 and the negative electrode tab 121. That is, the first measuring lead 330 and the second measuring lead 340 may be formed in parallel to the positive electrode lead 310 and the negative electrode lead 320. For example, as shown in FIG. 1, the first measuring tab 131 and the second measuring tab 141 may be formed at positions located at a predetermined distance apart in x-axis direction or in x- and z-axis direction from the positive electrode tab 111 and the negative electrode tab 121 between the positive electrode tab 111 and the negative electrode tab 121. Additionally, the positive electrode lead 310, the negative electrode lead 320, the first measuring lead 330 and the second measuring lead 340 may be formed in parallel such that parts of the positive electrode lead 310, the negative electrode lead 320, the first measuring lead 330 and the second measuring lead 340 extending out of the packaging material 200 may run in parallel. Specifically, the positive electrode lead 310, the negative electrode lead 320, the first measuring lead 330 and the second measuring lead 340 may be disposed on the same virtual plane such that each of their lengthwise directions may face the same direction. For example, referring to FIG. 2, the positive electrode lead 310, the negative electrode lead 320, the first measuring lead 330 and the second measuring lead 340 may be disposed on the same plane such that each of their upper surfaces may run in parallel and each of their lengthwise directions may face the same +y direction. According to this configuration of the present disclosure, it is possible to easily charge and discharge the secondary battery and estimate the state of the secondary battery. Particularly, according to this configuration of the present disclosure, the state of the secondary battery may be easily estimated by the first measuring tab and the second measuring tab formed at different positions in the horizontal direction from the positive electrode tab and the negative electrode tab used to charge and discharge the secondary battery.

Referring to FIG. 3, the electrode assembly 100 according to the present disclosure may include the plurality of electrode plates stacked in the up-down direction. Particularly, the first measuring plate 130 and the second measuring plate 140 may be provided in place of at least one electrode plate of the plurality of positive electrode plates 110 and the plurality of negative electrode plates 120. More specifically, the first measuring plate 130 and the second measuring plate 140 may be stacked in the same layer in the electrode assembly 100 having a stack of the plurality of electrode plates.

For example, as shown in FIG. 3, the first measuring plate 130 and the second measuring plate 140 may be provided at the position of a positive electrode plate 110 in place of the positive electrode plate 110. That is, the first measuring plate 130 and the second measuring plate 140 may be provided in the same layer between two negative electrode plates 120. Additionally, although not shown in the drawing, the first measuring plate 130 and the second measuring plate 140 may be provided at the position of a negative electrode plate 120 in place of the negative electrode plate 120. That is, the first measuring plate 130 and the second measuring plate 140 may be provided in the same layer between two positive electrode plates 110. According to this configuration of the present disclosure, it is possible to measure a potential difference caused by non-uniformity inside the secondary battery and thus estimate the state of the secondary battery more accurately.

Figure 4:
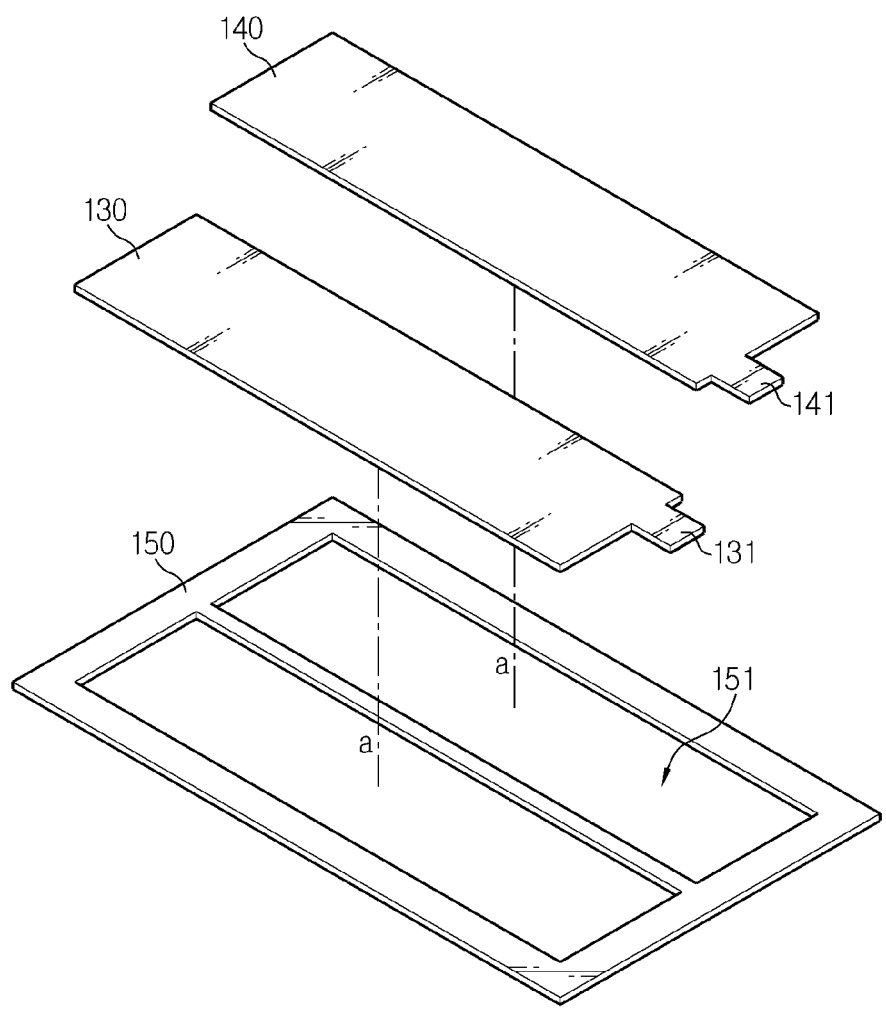
FIGS. 4 and 5 are schematic exploded perspective views showing connection of a measuring plate and an insulating element according to different embodiments of the present disclosure.
Figure 5:
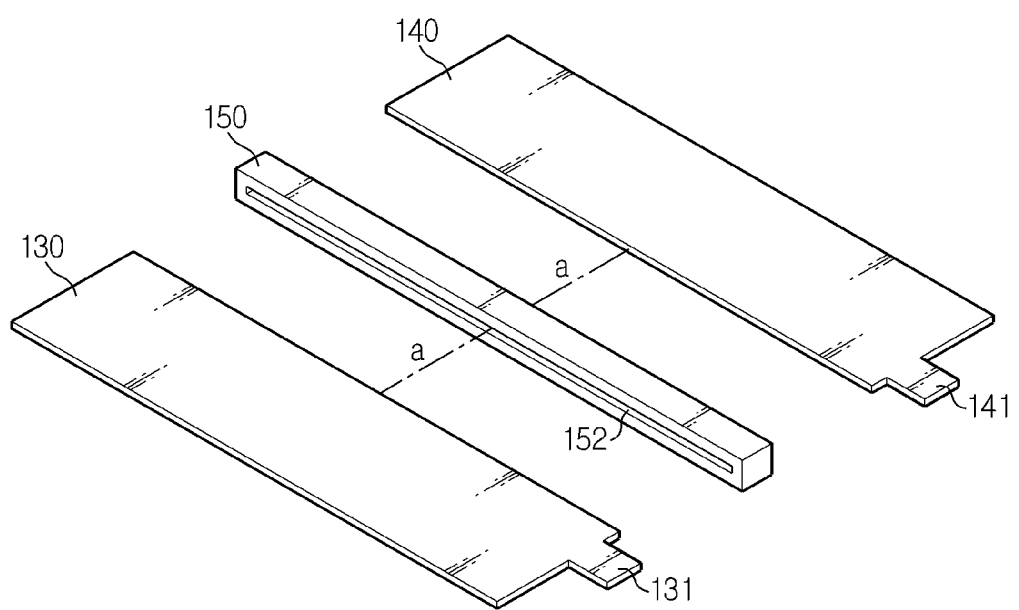

The electrode assembly 100 according to the present disclosure may further include an insulating element 150. This will be described in more detail with reference to FIGS. 4 and 5. FIGS. 4 and 5 are schematic exploded perspective views showing connection of the measuring plate and the insulating element according to different embodiments of the present disclosure.

Referring to FIGS. 4 and 5, the insulating element 150 may fix the first measuring plate 130 and the second measuring plate 140. More specifically, the insulating element 150 may fix the first measuring plate 130 and the second measuring plate 140 such that the first measuring plate 130 and the second measuring plate 140 may be disposed in parallel in one layer among the plurality of electrode plates.

For example, as shown in FIG. 4, the insulating element 150 may be made of an insulating material, and may be implemented as a plate of the same size as the electrode plate provided in the electrode assembly 100. Additionally, the insulating element 150 may have an internal space 151 of the same size as the area of the first measuring plate 130 and the second measuring plate 140. Here, the internal space 151 may be an empty space that is open in the vertical direction, with the open top and bottom in the same size as the area of the first measuring plate 130 and the second measuring plate 140. Additionally, the first measuring plate 130 and the second measuring plate 140 may be provided in the internal space 151. Here, the first measuring plate 130 and the second measuring plate 140 may be inserted and fixed into the internal space 151 of the insulating element 150 in the direction a of FIG. 4. In this instance, the internal space into which the first measuring plate 130 is inserted and the internal space into which the second measuring plate 140 is inserted may be spaced a predetermined distance apart in a first direction. Here, the first direction may include the x-axis direction shown in FIGS. 2 and 3. Accordingly, the first measuring plate 130 and the second measuring plate 140 may be mounted in the insulating element 150 and kept in electrically insulated state. As another example, as shown in FIG. 5, the insulating element 150 may be made of an insulating material and disposed between the first measuring plate 130 and the second measuring plate 140. For example, the insulating element 150 may be formed in the shape of a bar that extends in the lengthwise direction of the first measuring plate 130 and the second measuring plate 140. Additionally, the insulating element 150 may be interposed between the first measuring plate 130 and the second measuring plate 140 arranged in parallel in the horizontal direction, namely, the first direction, with wide surfaces lying upwards and downwards, to separate the first measuring plate 130 from the second measuring plate 140. Through the insulating element 150, the first measuring plate 130 and the second measuring plate 140 may be kept in electrically insulated state.

Particularly, the insulating element 150 may be configured such that the first measuring plate 130 and the second measuring plate 140 may be inserted into the insulating element 150. More specifically, the insulating element 150 may have an inner groove 152. The inner groove 152 may extend straight in the lengthwise direction of the first measuring plate 130 and the second measuring plate 140 such that the first measuring plate 130 and the second measuring plate 140 are coupled to the inner groove 152. Here, the first measuring plate 130 and the second measuring plate 140 may be inserted and fixed into the inner groove 152 of the insulating element 150 in the direction a of FIG. 5.

Additionally, the insulating element 150 may electrically insulate the first measuring plate 130 from the second measuring plate 140. More specifically, the insulating element 150 may separate the first measuring plate 130 from the second measuring plate 140 to maintain a predetermined distance between the first measuring plate 130 and the second measuring plate 140. Additionally, the insulating element 150 may be made of an insulating material, to prevent the contact between the first measuring plate 130 and the second measuring plate 140. For example, as shown in FIGS. 4 and 5, the first measuring plate 130 and the second measuring plate 140 may be spaced apart by the insulating element 150 to prevent the contact between.

Figure 6:
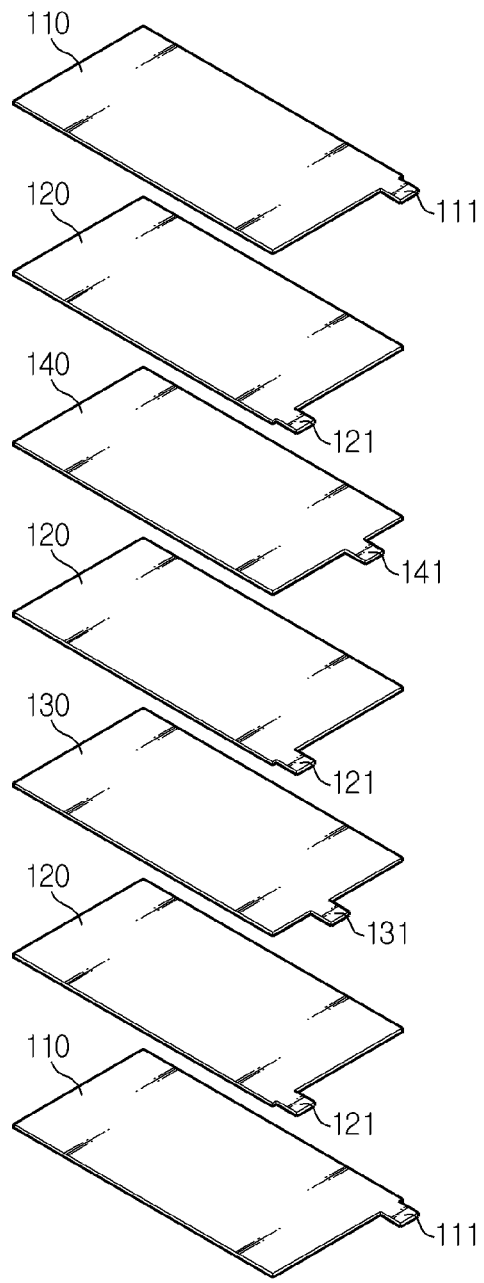
FIG. 6 is a schematic exploded perspective view showing the configuration of an electrode assembly according to another embodiment of the present disclosure.

FIG. 6 is a schematic exploded perspective view showing the configuration of the electrode assembly according to another embodiment of the present disclosure. However, for convenience of description, the separator is not shown in FIG. 6. Additionally, in this embodiment, for the parts to which the description of the previous embodiment may be similarly applied, a detailed description is omitted herein, and it will be described primarily based on difference(s).

Referring to FIG. 6, the electrode assembly 100 according to the present disclosure may include the plurality of electrode plates 110, 120, 130 and 140 stacked in the up-down direction. Particularly, the first measuring plate 130 and the second measuring plate 140 may be provided at the position of two electrode plates in place of the two electrode plates having the same polarity among the plurality of positive electrode plates 110 and the plurality of negative electrode plates 120. That is, the first measuring plate 130 may be provided in place of a specific electrode plate of the plurality of positive electrode plates 110 and the plurality of negative electrode plates 120, and the second measuring plate 140 may be provided in place of a different electrode plate having the same polarity as the above specific electrode plate of the plurality of positive electrode plates 110 and the plurality of negative electrode plates 120. The first measuring plate 130 and the second measuring plate 140 may be stacked in different layers.

For example, as shown in FIG. 6, each of the first measuring plate 130 and the second measuring plate 140 may be provided at the position of each of two positive electrode plates 110 in place of the two positive electrode plates 110. That is, the first measuring plate 130 may be provided at the position of a first positive electrode plate among the plurality of positive electrode plates 110, and the second measuring plate 140 may be provided at the position of a second positive electrode plate that is not identical to the first positive electrode plate among the plurality of positive electrode plates 110. Accordingly, each of the first measuring plate 130 and the second measuring plate 140 may be provided between the negative electrode plates, and the first measuring plate 130 and the second measuring plate 140 may be provided in different layers.

Additionally, although not shown in the drawing, the first measuring plate 130 and the second measuring plate 140 may be provided at the position of two negative electrode plates 120 in place of the two negative electrode plates 120. That is, the first measuring plate 130 may be provided at the position of a first negative electrode plate among the plurality of negative electrode plates 120, and the second measuring plate 140 may be provided at the position of a second negative electrode plate that is not identical to the first negative electrode plate among the plurality of negative electrode plates 120. Accordingly, each of the first measuring plate 130 and the second measuring plate 140 may be provided between the positive electrode plates, and the first measuring plate 130 and the second measuring plate 140 may be provided in different layers.

According to this configuration of the present disclosure, the first measuring plate and the second measuring plate are not included in any one of the positive electrode plate and the negative electrode plate such that they are spaced a predetermined apart, and instead, two selected from the plurality of positive electrode plates or two selected from the plurality of negative electrode plates are replaced with the first measuring plate and the second measuring plate in the manufacture of the secondary battery according to the present disclosure, which makes it easier to manufacture the secondary battery.

Figure 7:
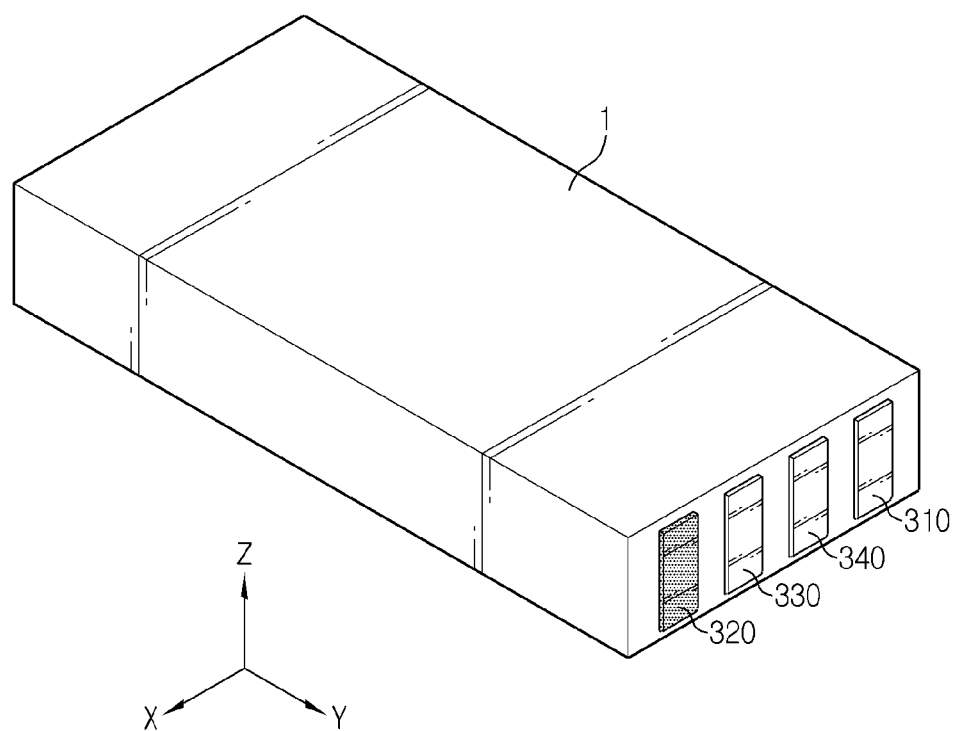
FIG. 7 is a schematic perspective view showing the configuration of a secondary battery according to an embodiment of the present disclosure.

FIG. 7 is a schematic perspective view showing the configuration of the secondary battery according to an embodiment of the present disclosure.

Referring to FIG. 7, the secondary battery 1 according to an embodiment of the present disclosure having taped outer surfaces may be fixed. For example, the secondary battery 1 may be formed in the shape of a rectangular prism with the taped outer surfaces. Alternatively, the secondary battery 1 may have outer surfaces surrounded by the case.

Additionally, the secondary battery 1 may include the plurality of leads on one side. For example, the secondary battery 1 may include the positive electrode lead 310, the negative electrode lead 320, the first measuring lead 330 and the second measuring lead 340 on one side of +y-axis direction of FIG. 7.

Preferably, the positive electrode lead 310, the negative electrode lead 320, the first measuring lead 330 and the second measuring lead 340 according to the present disclosure may be bent in upward or downward direction. More specifically, the positive electrode lead 310, the negative electrode lead 320, the first measuring lead 330 and the second measuring lead 340 may be bent in upward or downward direction such that flat surfaces face the outward direction of the secondary battery 1. For example, as shown in the configuration of FIG. 7, the positive electrode lead 310, the negative electrode lead 320, the first measuring lead 330 and the second measuring lead 340 may be bent in the same direction of +z-axis direction or −z-axis direction such that flat upper surfaces face in +y-axis direction. According to this configuration of the present disclosure, the plurality of leads may easily come into contact with measuring terminals.

The secondary battery according to an embodiment of the present disclosure may be connected to an apparatus for secondary battery state estimation. Here, the apparatus for secondary battery state estimation is an apparatus for estimating the state of the secondary battery, and further the degradation of the secondary battery. Additionally, the apparatus for secondary battery state estimation may estimate the life or degradation of the secondary battery through secondary battery state estimation. Particularly, the apparatus for secondary battery state estimation may be connected to each lead of the secondary battery 1 to estimate the life of the secondary battery.

The secondary battery according to the present disclosure may be provided in a battery pack itself. That is, the battery pack according to the present disclosure may include the secondary battery according to the present disclosure as described above. Here, the battery pack may include a plurality of secondary batteries, the secondary battery, electrical components (BMS, relay, fuse, etc.) and a case.

While the present disclosure has been hereinabove described with regard to a limited number of embodiments and drawings, the present disclosure is not limited thereto, and it is obvious to those skilled in the art that various modifications and changes may be made thereto within the technical aspects of the present disclosure and the equivalent scope of the appended claims.

What is claimed is:

1. A secondary battery comprising:
a packaging material including an upper cover and a lower cover, the packaging material formed by sealing an outer periphery of the upper cover and an outer periphery of the lower cover;
an electrode assembly including a stack having a plurality of first electrode plates and a plurality of second electrode plates stacked along a stacking axis, the first electrode plates being at respective first locations along the stacking axis and the second electrode plates being at respective second locations along the stacking axis, the first and second locations alternating with one another along the stacking axis and having a separator interposed between each of the first and second locations, wherein the electrode assembly includes a first measuring plate and a second measuring plate having a same polarity as the first electrode plates, both of the first and second measuring plates being located at a single one of the first locations within the stack, such that the first measuring plate and the second measuring plate are spaced a predetermined distance apart along a direction transverse to the stacking axis, wherein a first electrode tab extends from each of the plurality of first electrode plates, a second electrode tab extends from each of the plurality of second electrode plates, a first measuring tab extends from the first measuring plate, and a second measuring tab extends from the second measuring plate;

a first electrode lead having one end connected to the first electrode tabs of the plurality of first electrode plates and an opposing end exposed outside the packaging material;

a second electrode lead having one end connected to the second electrode tabs of the plurality of second electrode plates and an opposing end exposed outside the packaging material;

a first measuring lead having one end connected to the first measuring tab and an opposing end exposed outside the packaging material; and a second measuring lead having one end connected to the second measuring tab and an opposing end exposed outside the packaging material, wherein the first electrode plates have a different polarity than the second electrode plates.

2. The secondary battery according to claim 1, wherein the electrode assembly further includes an insulating element, at least a portion of the insulating element being positioned between the first and second measuring plates to electrically isolate the first measuring plate from the second measuring plate.

3. The secondary battery according to claim 1, wherein the first measuring plate and the second measuring plate are located at any two respective ones of the plurality of first locations.

4. The secondary battery according to claim 1, wherein the electrode assembly is configured such that the first electrode lead, the second electrode lead, the first measuring lead, and the second measuring lead are disposed on a single plane with each of their lengthwise directions facing a single direction.

5. The secondary battery according to claim 1, wherein the first measuring tab is integrated with the first measuring lead in the form of a plate, and the second measuring tab is integrated with the second measuring lead in the form of a plate.

6. The secondary battery according to claim 1, wherein the first electrode lead, the second electrode lead, the first measuring lead, and the second measuring lead extend out of the packaging material in a single direction.

7. The secondary battery according to claim 6, wherein the first electrode lead, the second electrode lead, the first measuring lead, and the second measuring lead are bent up or down in a single direction.

8. A battery pack comprising the secondary battery according to claim 1.

9. The secondary battery according to claim 2, wherein the insulating element is configured to secure the first measuring plate with respect to the second measuring plate.

10. The secondary battery according to claim 9, wherein the insulating element comprises a plate having a first internal space configured to receive the first measuring plate and a second internal space configured to receive the second measuring plate.

11. The secondary battery according to claim 9, wherein the insulating element is elongated along a longitudinal axis separating the first and second measuring plates, the insulating element having a first groove and a second groove positioned on opposing sides of the longitudinal axis, wherein the first groove is configured to receive the first measuring plate and the second groove is configured to receive the second measuring plate.

* * * * *